US011942969B2

(12) United States Patent
Lu et al.

(10) Patent No.: US 11,942,969 B2
(45) Date of Patent: *Mar. 26, 2024

(54) METHODS AND APPARATUS FOR UNIFIED SIGNIFICANCE MAP CODING

(71) Applicant: INTERDIGITAL MADISON PATENT HOLDINGS, SAS, Paris (FR)

(72) Inventors: Xiaoan Lu, Yardley, PA (US); Joel Sole, San Diego, CA (US); Peng Yin, Ithaca, NY (US); Qian Xu, Folsom, CA (US); Yunfei Zheng, San Jose, CA (US)

(73) Assignee: INTERDIGITAL MADISON PATENT HOLDINGS, SAS, Paris (FR)

( * ) Notice: Subject to any disclaimer, the term of this patent is extended or adjusted under 35 U.S.C. 154(b) by 0 days.

This patent is subject to a terminal disclaimer.

(21) Appl. No.: 18/138,947

(22) Filed: Apr. 25, 2023

(65) Prior Publication Data

US 2023/0261672 A1  Aug. 17, 2023

Related U.S. Application Data

(63) Continuation of application No. 17/692,563, filed on Mar. 11, 2022, now Pat. No. 11,671,112, which is a
(Continued)

(51) Int. Cl.
*H03M 7/40* (2006.01)
*H04N 19/122* (2014.01)
(Continued)

(52) U.S. Cl.
CPC ........ *H03M 7/4006* (2013.01); *H04N 19/122* (2014.11); *H04N 19/13* (2014.11);
(Continued)

(58) Field of Classification Search
CPC ... H03M 7/4006; H04N 19/122; H04N 19/13; H04N 19/176; H04N 19/91; H04N 19/18;
(Continued)

(56) References Cited

U.S. PATENT DOCUMENTS 6,778,709 B1   8/2004   Taubman
7,702,013 B2   4/2010   Schwarz et al.
(Continued)

FOREIGN PATENT DOCUMENTS

JP   2005229632   8/2005
JP   2005530375   10/2005
(Continued)

OTHER PUBLICATIONS

Marpe et al., "Context-based adaptive binary arithmetic coding in the H.264/AVC video compression standard," IEEE Transactions on Circuits and Systems for Video Technology, vol. 13, No. 7, Jul. 1, 2003, pp. 620-636.
(Continued)

*Primary Examiner* — Jared Walker
(74) *Attorney, Agent, or Firm* — Ronald Kolczynski

(57) ABSTRACT

Methods and apparatus are provided for unified significance map coding. An apparatus includes a video encoder (400) for encoding transform coefficients for at least a portion of a picture. The transform coefficients are obtained using a plurality of transforms. One or more context sharing maps are generated for the transform coefficients based on a unified rule. The one or more context sharing maps are for providing at least one context that is shared among at least some of the transform coefficients obtained from at least two different ones of the plurality of transforms.

15 Claims, 8 Drawing Sheets

Related U.S. Application Data continuation of application No. 17/154,283, filed on Jan. 21, 2021, now Pat. No. 11,309,910, which is a continuation of application No. 16/374,815, filed on Apr. 4, 2019, now Pat. No. 11,177,826, which is a continuation of application No. 15/709,965, filed on Sep. 20, 2017, now Pat. No. 10,305,510, which is a continuation of application No. 13/696,852, filed as application No. PCT/US2011/000831 on May 11, 2011, now Pat. No. 9,793,921.

(60) Provisional application No. 61/333,808, filed on May 12, 2010.

(51) Int. Cl.
*H04N 19/13* (2014.01)
*H04N 19/176* (2014.01)
*H04N 19/18* (2014.01)
*H04N 19/64* (2014.01)
*H04N 19/91* (2014.01)

(52) U.S. Cl.
CPC ........... *H04N 19/176* (2014.11); *H04N 19/91* (2014.11); *H04N 19/18* (2014.11); *H04N 19/64* (2014.11)

(58) Field of Classification Search
CPC .... H04N 19/64; H04N 19/129; H04N 19/132; H04N 19/60
See application file for complete search history.

(56) References Cited

U.S. PATENT DOCUMENTS

| | | |
|---|---|---|
| 2004/0013194 A1 | 1/2004 | Piche et al. |
| 2004/0114683 A1 | 6/2004 | Schwarz et al. |
| 2005/0084014 A1 | 4/2005 | Wang et al. |
| 2005/0094731 A1 | 5/2005 | Xu et al. |
| 2007/0237240 A1 | 10/2007 | Lee et al. |
| 2008/0219578 A1 | 9/2008 | Lee |
| 2008/0267513 A1 | 10/2008 | Sankaran |
| 2009/0135915 A1 | 5/2009 | Marpe et al. |
| 2010/0040138 A1 | 2/2010 | Marpe et al. |

FOREIGN PATENT DOCUMENTS

| | | |
|---|---|---|
| WO | 2008108534 | 9/2008 |
| WO | WO2009089370 | 7/2009 |
| WO | WO2011128303 | 10/2011 |

OTHER PUBLICATIONS

Itu, "Advanced video coding for generic audiovisual services," ITU-T Recommendation H.264, Series H: Audiovisual and Multimedia Systems, Infrastructure of audiovisual services—Coding of moving video, Mar. 2005, 343 pages.

Winken et al., "Description of video coding technology proposal by Fraunhofer HHI," JCT-VC of ITU-T SG16 WP3 and ISO/IEC JTC1/SC29/WG11, Doc.: JCTVC-A116, 1st Meeting Dresden, DE, Apr. 15-23, 2010, pp. 1-44.

Chen et al., "Video Coding Using Extended Block Sizes," ITU Study Group 16, Question 6, Video Coding Experts Group (VCEG), Doc. VCEG-AJ23, 36th Meeting: San Diego, USA, Oct. 8-10, 2008, pp. 1-3.

Kirchhoffer et al., "Proposed Modifications to Residual Coding Part of Frame-based Animated Mesh Compression," ITU Study Group 16, Video Coding Experts Group, No. M14697, Jun. 27, 2007.

Richardson, "H.264/MPEG-4 Part 10 White Paper, Transform and Quantization," Internet Citation, Mar. 19, 2003, pp. 1-9.

Sasai et al., "CE11: Context Size Reduction for the Significance Map," MPEG Meeting: Mar. 16-23, 2011, Geneva, Motion Picture Expert Group, No. m19750, Mar. 18, 2011.

Davies et al., "Suggestion for a Test Model," Joint Collaborative Team on Video Coding (JCT-VC) of ITU-T SG16 WP3 and ISO/IEC JTC1/SC29/WG11, 1st Mtg., Dresden, DE, Apr. 15-23, 2010, Doc. JCTVC-A033.

Wien, Variable Block-Size Transforms for Hybrid Video Coding, Dissertation der Rheinisch-Westfaelischen Technischen Hochschule Aachen, p. 1-183, (2004).

METHODS AND APPARATUS FOR UNIFIED SIGNIFICANCE MAP CODING

CROSS-REFERENCE TO RELATED APPLICATIONS

This application claims the benefit of U.S. Provisional Application Ser. No. 61/333,808, filed on May 12, 2010, which is incorporated by reference herein in its entirety.

TECHNICAL FIELD

The present principles relate generally to video encoding and decoding and, more particularly, to methods and apparatus for unified significance map coding.

BACKGROUND

To exploit the non-stationary characteristics of input video content, a video encoder relies on an entropy coding to map an input video signal to a bitstream of variable length-coded syntax elements. Frequently-occurring symbols are represented with short codewords while less common symbols are represented with long codewords.

The International Organization for Standardization/International Electrotechnical Commission (ISO/IEC) Moving Picture Experts Group-4 (MPEG-4) Part 10 Advanced Video Coding (AVC) Standard/International Telecommunication Union, Telecommunication Sector (ITU-T) H.264 Recommendation (hereinafter the "MPEG-4 AVC Standard") supports two entropy coding methods. In particular, symbols are coded using either variable-length codes (VLCs) or context-adaptive arithmetic coding (CABAC) depending on the entropy encoding mode. Using CABAC, the process of coding a data symbol includes the following three elementary steps:

1. Binarization: In the binarization step, a given non-binary valued syntax element is uniquely mapped to a binary sequence, called a bin string. This process is similar to the process of converting a symbol into a variable-length code but the binary code is further encoded.
2. Context modeling: A "context model" is a probability model for one or more bins of the bin strings, and is chosen from a selection of available models depending on the statistics of recently-coded data symbols. The context model stores the probability of each bin being a "1" or "0", and it is updated based on the actual coded value.
3. Binary arithmetic coding: An arithmetic coder encodes each bin according to the selected probability model.

In the MPEG-4 AVC Standard, context models and binarization schemes for each syntax element are defined in the standard. The context model of each bin is identified by a context index $\gamma$ and each probability model related to a given context index $\gamma$ is determined by a pair of two values, namely a probability state index $\sigma_\gamma$ and the (binary) value $\bar{\omega}_\gamma$ of the most probable symbol (MPS).

Suppose a pre-defined set of past symbols, called a context template T, and a related set $C=\{0, \ldots, C-1\}$ of contexts is given, where the contexts are specified by a modeling function $F: T \rightarrow C$ operating on the template T. For each symbol x to be coded, a conditional probability $p(x|F(z))$ is estimated by switching between different probability models according to the already coded neighboring symbols $z \in T$. After encoding x using the estimated conditional probability $p(x|F(z))$, the probability model is updated with the value of the encoded symbol x. Thus, $p(x|F(z))$ is estimated on the fly by tracking the actual source statistics. To reduce the model cost and avoid inaccurate estimates of $p(x|F(z))$ due to a large number of C, the MPEG-4 AVC Standard puts two restrictions on the choice of the context models. First, very limited context templates T consisting of a few neighbors of the current symbol to encode are employed. Second, context modeling is restricted to the selected bins of the binarized symbols.

At the beginning of each coded slice, the context models are initialized depending on the initial value of the Quantization Parameter (QP) since the quantization parameter has a significant effect on the probability of occurrence of the various data symbols.

CABAC Entropy Coding of Residual Data in the MPEG-4 AVC Standard

For the CABAC coding of the residual data in accordance with the MPEG-4 AVC Standard, the syntax elements and their related coding scheme are characterized by the following distinct features:

- A one-bit symbol coded_block_flag and a binary-valued significance map are used to indicate the occurrence and the location of nonzero transform coefficients (namely, significant coefficients) in a given block.
- Non-zero levels are encoded in the reverse scanning order.
- Context models for coding of nonzero transform coefficients are chosen based on the number of previously transmitted nonzero levels within the reverse scanning path.

Turning to FIG. 1, an example of the significance map encoding procedure in accordance with the MPEG-4 AVC Standard is indicated generally by the reference numeral 100. The procedure 100 includes a start block 110 that passes control to a function block 120. The function block 120 encodes a syntax element coded_block_flag, and passes control to a decision block 130. The decision block 130 determines whether or not coded_block_flag is equal to one. If so, then control is passed to a function 140. Otherwise, control is passed to an end block 199. The function block 140 performs steps relating to encoding the significance map, and passes control to a function block 150. The function block 150 performs steps relating to encoding level information, and passes control to the end block 199. Thus, regarding decision block 130, if the coded_block_flag indicates that a block has significant coefficients, then a binary-valued significance map is encoded by function block 140. For each coefficient in the scanning order, a one-bit symbol significant_coeff_flag is transmitted by function block 140. If the significant_coeff_flag symbol is equal to one, i.e., if a nonzero coefficient exists at this scanning position, then a further one-bit symbol last_significant_coeff_flag is sent by function block 140. This symbol last_significant_coeff_flag indicates if the current significant coefficient is the last one inside the block or if further significant coefficients follow.

When encoding the significance map of the transform coefficients, the choice of context models of significant_coeff_flag and last_significant_coeff_flag depend on the scanning position. In the MPEG-4 AVC Standard, for 4×4 or smaller transform sizes, a context model is assigned to significant_coeff_flag and last_significant_coeff_flag for each position, respectively. For the 8×8 transform size and larger, a few transform coefficient positions share one context model in order to reduce the number of context models.

Significance Map Coding in KTA

The video coding experts group (VCEG) "key technical area" (KTA) software has provided a common platform to integrate the new advances in video coding after the MPEG-4 AVC Standard is finalized. Proposals to use extended block sizes and large transforms were adopted into KTA. In the current KTA software, motion partitions larger than 16×16 pixels are implemented. In particular, macroblocks of sizes 64×64, 64×32, 32×64, 32×32, 32×16, 16×32 are used in addition to the existing MPEG-4 AVC Standard partitioning sizes. Larger block transforms are also used to better capture the smoother content in the high-definition video. Such larger block transforms include those having sizes of 16×16, 16×8, and 8×16. To keep the number of context models low, 8×16, 16×8, and 16×16 transforms all use 15 or fewer context models for significant_coeff_flag or last_significant_coeff_flag. Turning to FIG. 2, an example of using 15 contexts for a syntax element significant_coeff_flag for an 8×8 block is indicated generally by the reference numeral 200. In further detail, example 200 illustrates how multiple transform coefficient positions in a block share one context model when an 8×8 transform is used for significant_coeff_flag. Each different number represents a context model. When a number is repeated at multiple positions, these positions share one context model. In this approach, how multiple transform coefficient positions share one context, denoted as context sharing, is designed for each transform size. The exact pattern of context sharing is denoted as the context sharing map.

Turning to FIG. 3, an example of using 15 contexts for a syntax element significant_coeff_flag for a 16×16 block is indicated generally by the reference numeral 300. In further detail, example 300 illustrate how multiple transform coefficient positions in a block share one context model when a 16×16 transform is used for significant_coeff_flag. The pattern for context sharing of 16×16 transform is approximately an upsampled version of that of 8×8. However, this may disadvantageously fail to capture the difference in coefficient distributions of different transforms.

Significance Map Coding in a Particular Prior Art Approach

In a particular prior art approach, a new context modeling approach was proposed for 8×8 transform sizes and larger. To model the contexts for the syntax element significant_coeff_flag for 8×8 blocks, the transform block is decomposed into 16 sub-blocks of 2×2 samples, and each of these sub-blocks is associated with a separate context. The context model selection for larger transform blocks (e.g., for blocks greater than 8×8) is based on the number of already coded significant transform coefficients in a predefined neighborhood (inside the transform block). For coding of the last_significant_coeff_flag, a context modeling has been designed that depends on a distance measure of the current scan position to the top-left corner of the given transform block. To be more specific, the context model for coding the last_significant_coeff_flag is chosen based on the scan diagonal on which the current scanning position lies (i.e., it is chosen based on x+y, where x and y represent the horizontal and vertical location of a scanning position inside the transform block, respectively). To avoid over-fitting, the distance measure x+y is mapped on a reduced set of context models in a certain way (e.g., by quantizing x+y).

In the particular prior art method, the pattern for context sharing of an 8×8 transform is approximately an upsampled version of that of a 4×4 transform. However, this may also disadvantageously fail to capture the difference in coefficient distributions of different transforms.

In the existing video coding standards, when coding the significance map of the transform coefficients of 8×8 transforms or larger, one context is shared among several transform coefficients to reduce the number of contexts. Separate methods are used for various transforms on how to share the contexts. Such designs cannot be easily extended to future standards where more transforms may be used.

SUMMARY

These and other drawbacks and disadvantages of the prior art are addressed by the present principles, which are directed to methods and apparatus for unified significance map coding.

According to an aspect of the present principles, there is provided an apparatus. The apparatus includes a video encoder for encoding transform coefficients for at least a portion of a picture. The transform coefficients are obtained using a plurality of transforms. One or more context sharing maps are generated for the transform coefficients based on a unified rule. The one or more context sharing maps are for providing at least one context that is shared among at least some of the transform coefficients obtained from at least two different ones of the plurality of transforms.

According to another aspect of the present principles, there is provided a method in a video encoder. The method includes encoding transform coefficients for at least a portion of a picture. The transform coefficients are obtained using a plurality of transforms. One or more context sharing maps are generated for the transform coefficients based on a unified rule. The one or more context sharing maps are for providing at least one context that is shared among at least some of the transform coefficients obtained from at least two different ones of the plurality of transforms.

According to yet another aspect of the present principles, there is provided an apparatus. The apparatus includes a video decoder for decoding transform coefficients for at least a portion of a picture. The transform coefficients are obtained using a plurality of transforms. One or more context sharing maps are generated for the transform coefficients based on a unified rule. The one or more context sharing maps are for providing at least one context that is shared among at least some of the transform coefficients obtained from at least two different ones of the plurality of transforms.

According to still another aspect of the present principles, there is provided a method in a video decoder. The method includes decoding transform coefficients for at least a portion of a picture. The transform coefficients are obtained using a plurality of transforms. One or more context sharing maps are generated for the transform coefficients based on a unified rule. The one or more context sharing maps are for providing at least one context that is shared among at least some of the transform coefficients obtained from at least two different ones of the plurality of transforms.

These and other aspects, features and advantages of the present principles will become apparent from the following detailed description of exemplary embodiments, which is to be read in connection with the accompanying drawings.

BRIEF DESCRIPTION OF THE DRAWINGS

The present principles may be better understood in accordance with the following exemplary figures, in which.

DETAILED DESCRIPTION

Figure 1:
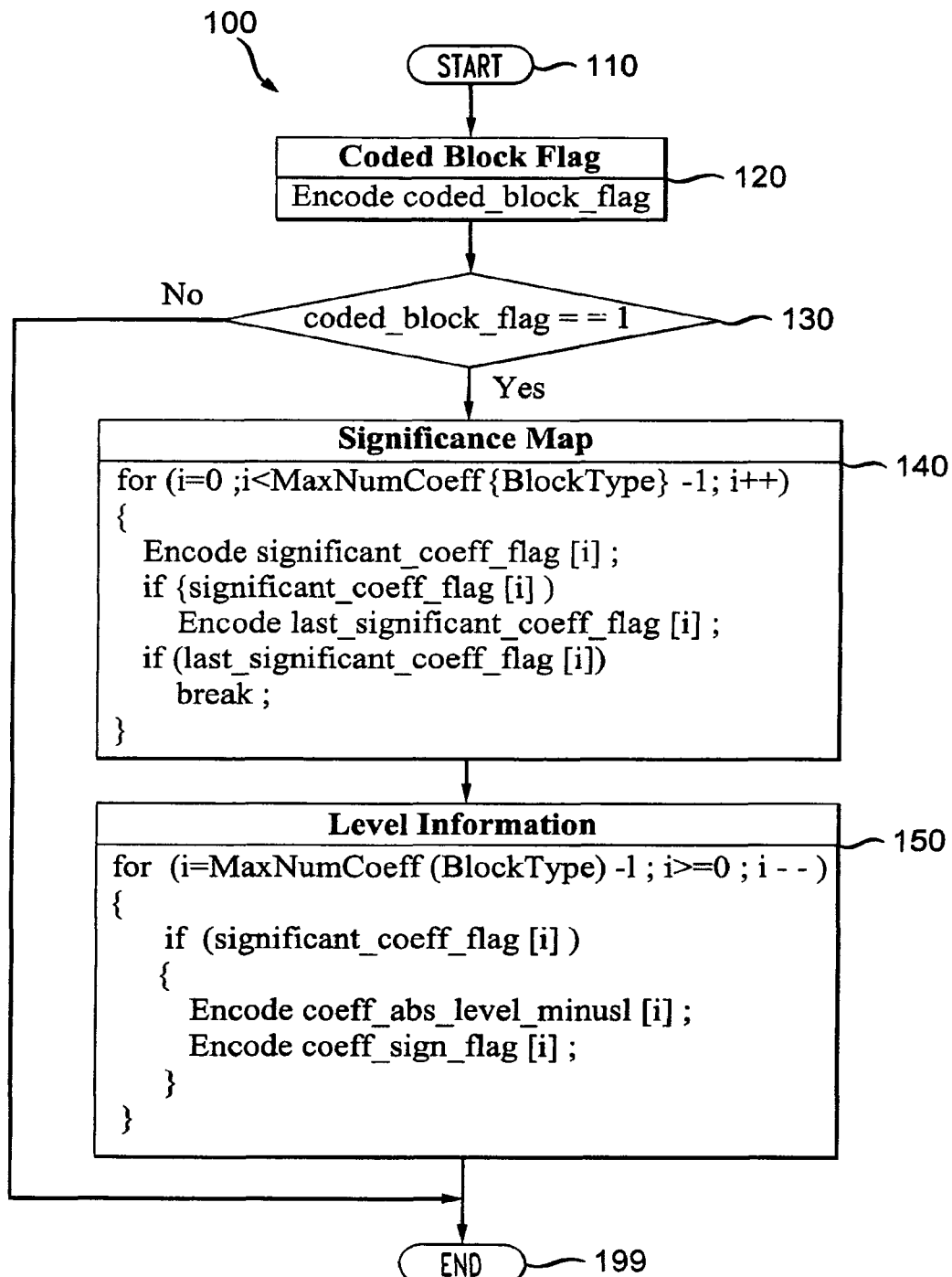
FIG. 1 is a diagram showing an example of the significance map encoding procedure in accordance with the MPEG-4 AVC Standard.
Figure 2:
FIG. 2 is a diagram showing an example of using 15 contexts for a syntax element significant_coeff_flag for an 8×8 block.
Figure 3:
FIG. 3 is a diagram showing an example of using 15 contexts for a syntax element significant_coeff_flag for a 16×16 block.

The present principles are directed to methods and apparatus for unified significance map coding.

The present description illustrates the present principles. It will thus be appreciated that those skilled in the art will be able to devise various arrangements that, although not explicitly described or shown herein, embody the present principles and are included within its spirit and scope.

All examples and conditional language recited herein are intended for pedagogical purposes to aid the reader in understanding the present principles and the concepts contributed by the inventor(s) to furthering the art, and are to be construed as being without limitation to such specifically recited examples and conditions.

Moreover, all statements herein reciting principles, aspects, and embodiments of the present principles, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that the block diagrams presented herein represent conceptual views of illustrative circuitry embodying the present principles. Similarly, it will be appreciated that any flow charts, flow diagrams, state transition diagrams, pseudocode, and the like represent various processes which may be substantially represented in computer readable media and so executed by a computer or processor, whether or not such computer or processor is explicitly shown.

The functions of the various elements shown in the figures may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor ("DSP") hardware, read-only memory ("ROM") for storing software, random access memory ("RAM"), and non-volatile storage.

Other hardware, conventional and/or custom, may also be included. Similarly, any switches shown in the figures are conceptual only. Their function may be carried out through the operation of program logic, through dedicated logic, through the interaction of program control and dedicated logic, or even manually, the particular technique being selectable by the implementer as more specifically understood from the context.

In the claims hereof, any element expressed as a means for performing a specified function is intended to encompass any way of performing that function including, for example, a) a combination of circuit elements that performs that function or b) software in any form, including, therefore, firmware, microcode or the like, combined with appropriate circuitry for executing that software to perform the function. The present principles as defined by such claims reside in the fact that the functionalities provided by the various recited means are combined and brought together in the manner which the claims call for. It is thus regarded that any means that can provide those functionalities are equivalent to those shown herein.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Also, as used herein, the words "picture" and "image" are used interchangeably and refer to a still image or a picture from a video sequence. As is known, a picture may be a frame or a field.

Additionally, as used herein, the phrases "significant coefficients" and "significant transform coefficients" refer to transform coefficients having a nonzero value.

Moreover, as used herein, the phrase "level information" refers to the value of a transform coefficient.

For purposes of illustration and description, examples are described herein in the context of improvements over the video coding experts group (VCEG) key technical area (KTA) software, using the KTA software as the baseline for our description and explaining the improvements and extensions beyond the KTA software. However, it is to be appreciated that the present principles are not limited solely to the KTA software and/or extensions thereof. Given the teachings of the present principles provided herein, one of ordinary skill in this and related arts would readily understand that the present principles are equally applicable and would provide at least similar benefits when applied to extensions of other standards, or when applied and/or incorporated within standards not yet developed. It is to be further appreciated that the present principles also apply to video encoders and video decoders that do not conform to standards, but rather confirm to proprietary definitions.

Figure 4:
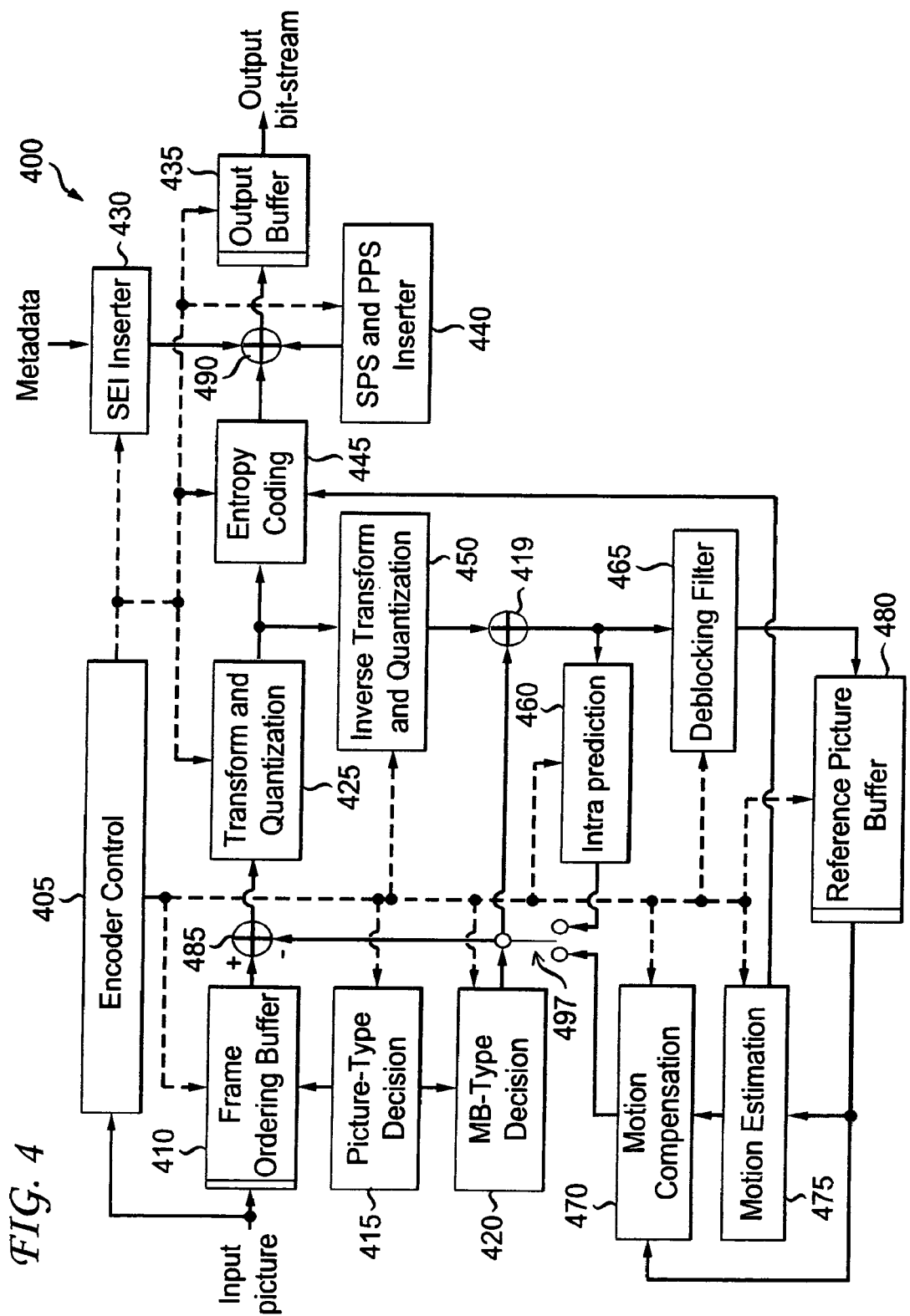
FIG. 4 is a block diagram showing an exemplary video encoder to which the present principles may be applied, in accordance with an embodiment of the present principles.

Turning to FIG. 4, an exemplary video encoder to which the present principles may be applied is indicated generally by the reference numeral 400. The video encoder 400 includes a frame ordering buffer 410 having an output in signal communication with a non-inverting input of a combiner 485. An output of the combiner 485 is connected in signal communication with a first input of a transformer and quantizer 425. An output of the transformer and quantizer 425 is connected in signal communication with a first input of an entropy coder 445 and a first input of an inverse transformer and inverse quantizer 450. An output of the entropy coder 445 is connected in signal communication with a first non-inverting input of a combiner 490. An output of the combiner 490 is connected in signal communication with a first input of an output buffer 435.

A first output of an encoder controller 405 is connected in signal communication with a second input of the frame ordering buffer 410, a second input of the inverse transformer and inverse quantizer 450, an input of a picture-type decision module 415, a first input of a macroblock-type (MB-type) decision module 420, a second input of an intra prediction module 460, a second input of a deblocking filter 465, a first input of a motion compensator 470, a first input of a motion estimator 475, and a second input of a reference picture buffer 480.

A second output of the encoder controller 405 is connected in signal communication with a first input of a Supplemental Enhancement Information (SEI) inserter 430, a second input of the transformer and quantizer 425, a second input of the entropy coder 445, a second input of the output buffer 435, and an input of the Sequence Parameter Set (SPS) and Picture Parameter Set (PPS) inserter 440.

An output of the SEI inserter 430 is connected in signal communication with a second non-inverting input of the combiner 490.

A first output of the picture-type decision module 415 is connected in signal communication with a third input of the frame ordering buffer 410. A second output of the picture-type decision module 415 is connected in signal communication with a second input of a macroblock-type decision module 420.

An output of the Sequence Parameter Set (SPS) and Picture Parameter Set (PPS) inserter 440 is connected in signal communication with a third non-inverting input of the combiner 490.

An output of the inverse quantizer and inverse transformer 450 is connected in signal communication with a first non-inverting input of a combiner 419. An output of the combiner 419 is connected in signal communication with a first input of the intra prediction module 460 and a first input of the deblocking filter 465. An output of the deblocking filter 465 is connected in signal communication with a first input of a reference picture buffer 480.

An output of the reference picture buffer 480 is connected in signal communication with a second input of the motion estimator 475 and a third input of the motion compensator 470. A first output of the motion estimator 475 is connected in signal communication with a second input of the motion compensator 470. A second output of the motion estimator 475 is connected in signal communication with a third input of the entropy coder 445.

An output of the motion compensator 470 is connected in signal communication with a first input of a switch 497. An output of the intra prediction module 160 is connected in signal communication with a second input of the switch 197. An output of the macroblock-type decision module 420 is connected in signal communication with a third input of the switch 497. The third input of the switch 497 determines whether or not the "data" input of the switch (as compared to the control input, i.e., the third input) is to be provided by the motion compensator 470 or the intra prediction module 460. The output of the switch 497 is connected in signal communication with a second non-inverting input of the combiner 419 and an inverting input of the combiner 485.

A first input of the frame ordering buffer 410 and an input of the encoder controller 405 are available as inputs of the encoder 400, for receiving an input picture. Moreover, a second input of the Supplemental Enhancement Information (SEI) inserter 430 is available as an input of the encoder 400, for receiving metadata. An output of the output buffer 435 is available as an output of the encoder 400, for outputting a bitstream.

Figure 5:
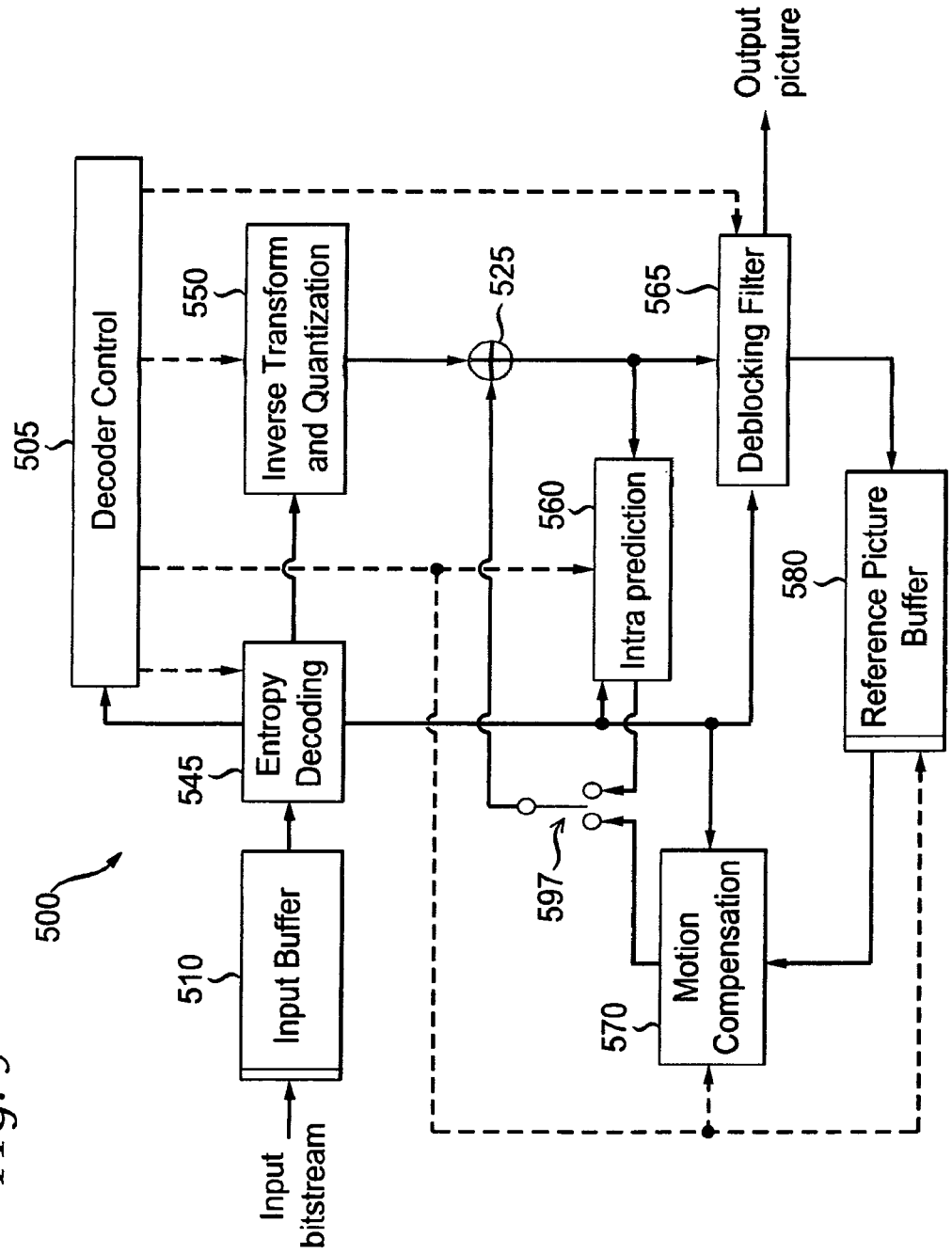
FIG. 5 is a block diagram showing an exemplary video decoder to which the present principles may be applied, in accordance with an embodiment of the present principles.

Turning to FIG. 5, an exemplary video decoder to which the present principles may be applied is indicated generally by the reference numeral 500. The video decoder 500 includes an input buffer 510 having an output connected in signal communication with a first input of an entropy decoder 545. A first output of the entropy decoder 545 is connected in signal communication with a first input of an inverse transformer and inverse quantizer 550. An output of the inverse transformer and inverse quantizer 550 is connected in signal communication with a second non-inverting input of a combiner 525. An output of the combiner 525 is connected in signal communication with a second input of a deblocking filter 565 and a first input of an intra prediction module 560. A second output of the deblocking filter 565 is connected in signal communication with a first input of a reference picture buffer 580. An output of the reference picture buffer 580 is connected in signal communication with a second input of a motion compensator 570.

A second output of the entropy decoder 545 is connected in signal communication with a third input of the motion compensator 570, a first input of the deblocking filter 565, and a third input of the intra predictor 560. A third output of the entropy decoder 545 is connected in signal communication with an input of a decoder controller 505. A first output of the decoder controller 505 is connected in signal communication with a second input of the entropy decoder 545. A second output of the decoder controller 505 is connected in signal communication with a second input of the inverse transformer and inverse quantizer 550. A third output of the decoder controller 505 is connected in signal communication with a third input of the deblocking filter 565. A fourth output of the decoder controller 505 is connected in signal communication with a second input of the intra prediction module 560, a first input of the motion compensator 570, and a second input of the reference picture buffer 580.

An output of the motion compensator 570 is connected in signal communication with a first input of a switch 597. An output of the intra prediction module 560 is connected in signal communication with a second input of the switch 597.

An output of the switch 597 is connected in signal communication with a first non-inverting input of the combiner 525.

An input of the input buffer 510 is available as an input of the decoder 500, for receiving an input bitstream. A first output of the deblocking filter 565 is available as an output of the decoder 500, for outputting an output picture.

As noted above, the present principles are directed to methods and apparatus for unified significance map coding. To consider the coefficient distributions from different transform sizes, we adapt context sharing patterns to the transform size, while keeping a unified structure for all transform sizes for simplicity.

In order to reduce the number of contexts in coding the residual data, a few transform coefficient positions may share one context model. In the MPEG-4 AVC Standard, the context sharing is designed for each transform.

In accordance with an embodiment of the present principles, we propose a unified rule-based approach to design for all transforms on how to share the contexts, where the rule is adaptive to the encoder setup.

In accordance with an embodiment of the present principles, we propose to unify the context sharing for multiple transforms. While still keeping the number of context models at a small number, different transforms use the same approach to design context sharing among multiple coefficient positions. This unifies the context sharing, preparing the next-generation of standards to accommodate more transforms.

The present principles propose new methods to code the significance map. Different from the prior art where a separate context sharing method is pre-defined for each transform, we provide a method to unify the context sharing among different transforms. This simplifies the design of an encoder and/or decoder, particularly when there are multiple transforms.

Typical Significance Map Coding

Figure 6:
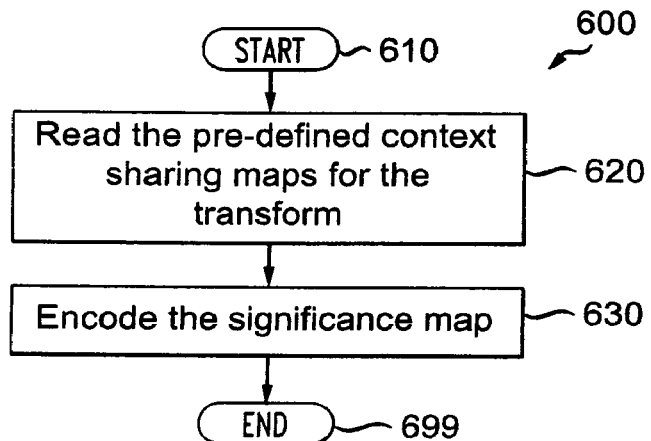
FIG. 6 is a flow diagram showing a conventional method for encoding a significance map.

Turning to FIG. 6, a conventional method for encoding a significance map is indicated generally by the reference numeral 600. The method 600 includes a start block 610 that passes control to a function block 620. The function block 620 reads the pre-defined context sharing maps for the transform, and passes control to a function block 630. The function block 630 encodes the significance map, and passes control to an end block 699. The context sharing maps are pre-defined for various transforms, and the sharing patterns may differ for significant_coeff_flag or last_significant_coeff_flag.

Figure 7:
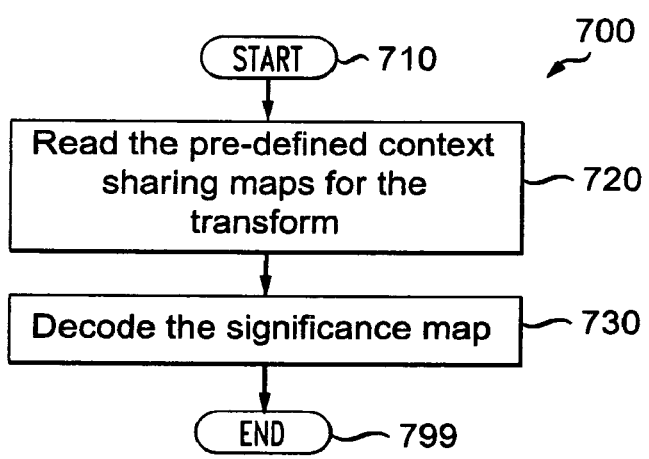
FIG. 7 is a flow diagram showing a conventional method for decoding a significance map.

Turning to FIG. 7, a conventional method for decoding a significance map is indicated generally by the reference numeral 700. The method 700 includes a start block 710 that passes control to a function block 720. The function block 720 reads the pre-defined context sharing maps for the transform, and passes control to a function block 730. The function block 730 decodes the significance map, and passes control to an end block 799. The decoder uses the corresponding context sharing map to decode the significance map.

Proposed Method—Unify the Context Sharing Map Generation

In the KTA software, macroblock sizes of 32×32 and 64×64 are supported. For 32×32 blocks, in addition to the existing MPEG-4 AVC Standard motion partition sizes (16×16, 16×8, 8×16, 8×8, 8×4, 4×8, and 4×4), inter coding using 32×32, 32×16 and 16×32 partitions is also enabled. Bigger transforms can better capture the smoother content in high-definition video. For inter pictures, 16×16, 16×8, and 8×16 transforms are used in addition to 4×4 and 8×8 transforms for the luma components. Specifically, for each motion partition of sizes 16×16, 16×8, and 8×16, transforms of sizes 16×16, 16×8, and 8×16 may be used in addition to the 4×4 and 8×8 transforms. For motion partitions bigger than 16×16, a 16×16 transform is used in addition to 4×4 and 8×8 transforms.

To encode the significance map of transform coefficients from newly introduced transforms (16×8, 8×16, and 16×16), separate context sharing maps are designed for each transform. For example, the pattern for context sharing of a 16×16 transform is approximately an upsampled version of that of 8×8. Since transforms usually compact energies into the first coefficients in the scanning order, such a context sharing may not suit the transform coefficient distribution. Further, such a context sharing requires storing the map for each transform.

We propose to unify the generation of the context sharing maps to simplify the encoder and/or decoder design. In one embodiment, we convert the 2-D transform coefficient block into a 1-D transform coefficient array according to a scanning order (for example, a zig-zag scanning order). Depending on the transform coefficient position x, we assign a context according to a rule F(x). This rule is consistent for all transforms. For example, $$F(x) = \begin{cases} x, & 0 \le x < N \\ N, & \text{otherwise} \end{cases},$$

where N is the number of contexts. For example, when N=15, there are 15 contexts.

When we apply this rule to generate the context sharing maps, there is no need to design separate maps for each transform, and it can be easily extended to multiple transforms. The same rule is known and used at both the encoder and decoder.

Figure 8:
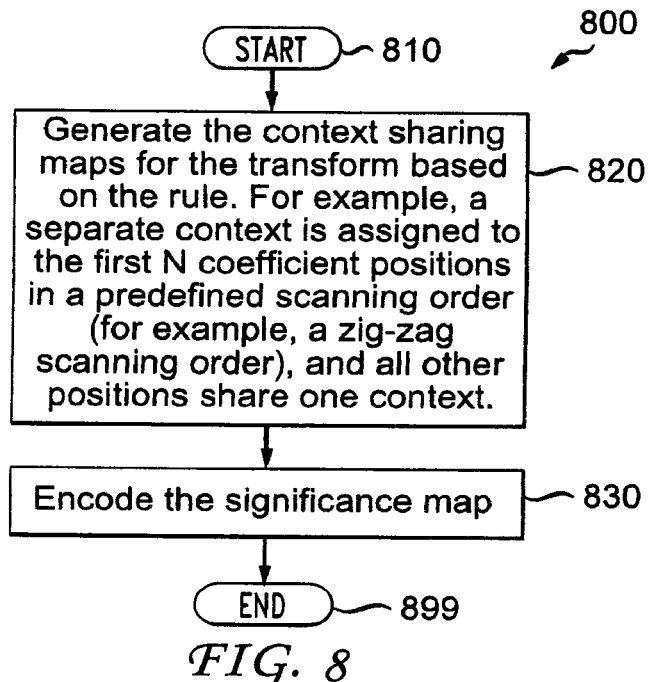
FIG. 8 is a flow diagram showing an exemplary method for encoding a significance map, in accordance with an embodiment of the present principles.

Turning to FIG. 8, an exemplary method for encoding a significance map is indicated generally by the reference numeral 800. The method 800 includes a start block 810 that passes control to a function block 820. The function block 820 generates the context sharing maps for the transform based on the rule, and passes control to a function block 830. The function block 830 encodes the significance map, and passes control to an end block 899. Regarding function block 820, the rule for generating the context sharing maps for the transform may involve, for example, assigning a separate context to the first N coefficient positions in a pre-defined scanning order (for example, a zig-zag scanning order), and having all other coefficient positions share one context.

Figure 9:
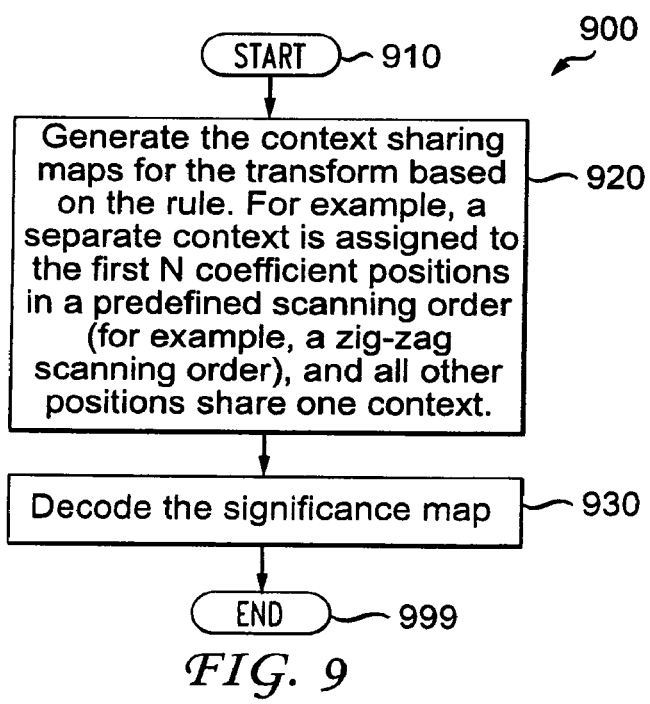
FIG. 9 is a flow diagram showing an exemplary method for decoding a significance map, in accordance with an embodiment of the present principles.

Turning to FIG. 9, an exemplary method for decoding a significance map is indicated generally by the reference numeral 900. The method 900 includes a start block 910 that passes control to a function block 920. The function block 920 generates the context sharing maps for the transform based on the rule, and passes control to a function block 930. The function block 930 decodes the significance map, and passes control to an end block 999. Regarding function block 920, the rule for generating the context sharing maps for the transform is the same as what is used at the encoder. It may involve, for example, assigning a separate context to the first N coefficient positions in a pre-defined scanning order (for example, a zig-zag scanning order), and having all other coefficient positions share one context.

Variation

In an embodiment of the present principles, the rule for generating the context sharing maps might vary for different sequences, picture resolutions, quantization parameters, and so forth. For example, we can have a variation of F(x) as follows:

$$F(x) = \begin{cases} x, & 0 \leq x < N \\ \frac{x-N}{2} + N, & x < M \\ \frac{x+N}{2}, & \text{otherwise} \end{cases}.$$

We propose to indicate which rule to use in the syntax. In one embodiment, the rules are known at both the encoder and the decoder. In such a case, the encoder indicates which rule to use through an index in the bitstream. This approach provides more flexibility.

Figure 10:
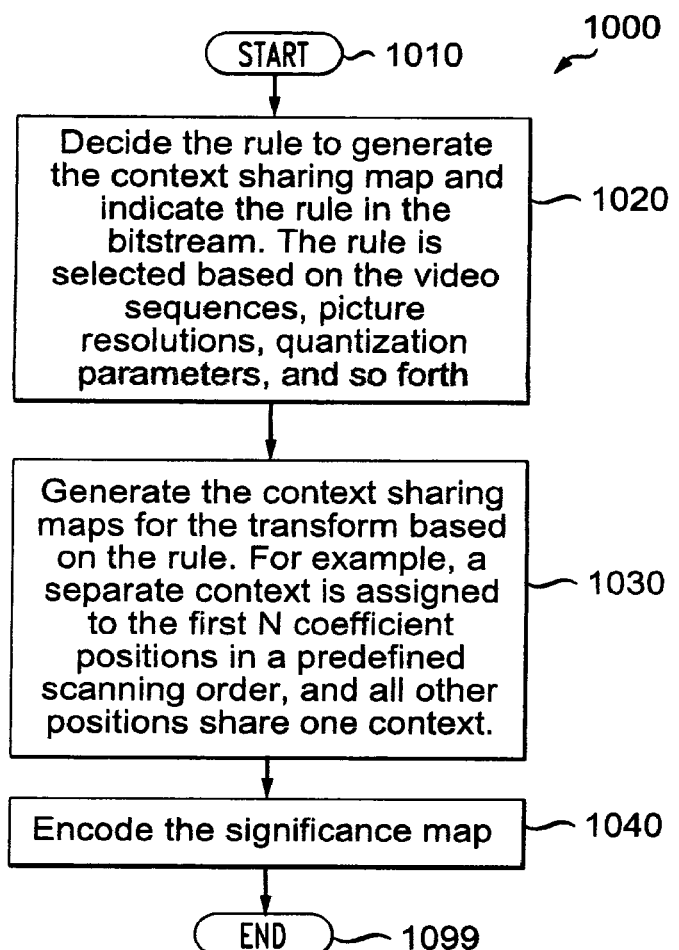
FIG. 10 is a flow diagram showing another method for encoding a significance map, in accordance with an embodiment of the present principles.

Turning to FIG. 10, another method for encoding a significance map is indicated generally by the reference numeral 1000. The method 1000 includes a start block 1010 that passes control to a function block 1020. The function block 1020 decides the rule to generate the context sharing map, indicates the rule in a bitstream, and passes control to a function block 1030. The function block 1030 generates the context sharing maps for the transform based on the rule, and passes control to a function block 1040. Regarding function block 1020, the rule may be selected based on video sequences to which the coefficients correspond, picture resolutions, quantization parameters, and so forth. Regarding function block 1030, the rule for generating the context sharing maps for the transform may involve, for example, assigning a separate context for the first N coefficient positions in a pre-defined scanning order, and having all other coefficient positions share one context.

Figure 11:
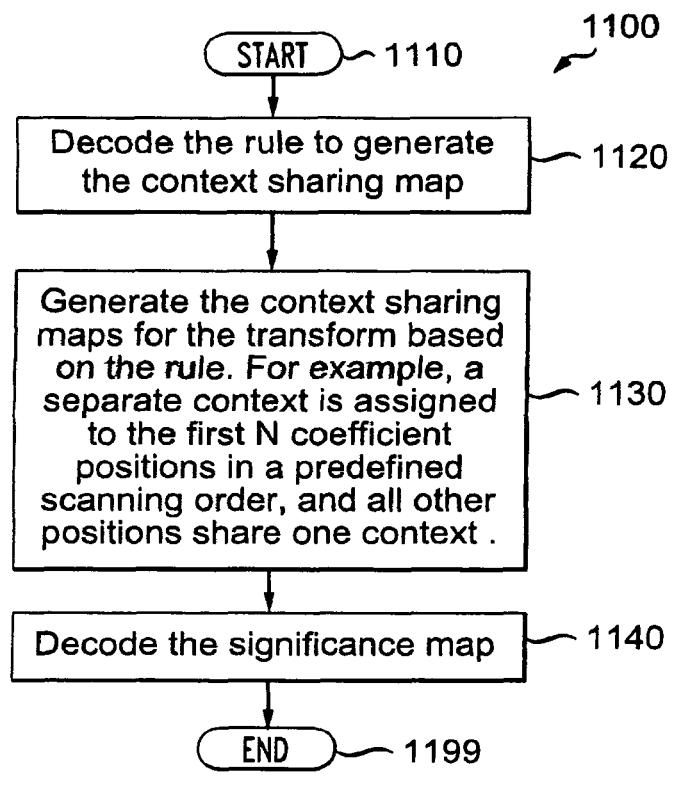
FIG. 11 is a flow diagram showing another exemplary method for decoding a significance map, in accordance with an embodiment of the present principles.

Turning to FIG. 11, another exemplary method for decoding a significance map is indicated generally by the reference numeral 1100. The method 1100 includes a start block 1110 that passes control to a function block 1120. The function block 1120 decodes the rule to generate the context sharing map, and passes control to a function block 1130. The function block 1130 generates the context sharing maps for the transform based on the rule, and passes control to a function block 1140. The function block 1140 decodes the significance map, and passes control to an end block 1199. Regarding function block 1130, the rule for generating the context sharing maps for the transform may involve, for example, assigning a separate context for the first N coefficient positions in a predefined scanning order, and having all other coefficient positions share one context.

Syntax

Our proposed method provides the flexibility to select the rule for generating the context sharing maps through, for example, the sequence parameter set (SPS) or picture parameter set (PPS). TABLE 1 shows exemplary syntax for use in a picture parameter set, in accordance with an embodiment of the present principles. Similar syntax can be applied on other syntax levels, including but not limited to the sequence parameter set.

TABLE 1

|  | C | Descriptor |
|---|---|---|
| pic_parameter_set_rbsp( ) { | | |
| ... | | |
| significance_map_context_rule | 1 | 1 ae(v) |
| ... | | |
| } | | |

The semantics of the syntax element shown in TABLE 1 is as follows:

significance_map_context_rule specifies the particular rule to be applied to generate the context sharing maps for coding the significance map.

A description will now be given of some of the many attendant advantages/features of the present invention, some of which have been mentioned above. For example, one advantage/feature is an apparatus having a video encoder for encoding transform coefficients for at least a portion of a picture. The transform coefficients are obtained using a plurality of transforms. One or more context sharing maps are generated for the transform coefficients based on a unified rule. The one or more context sharing maps are for providing at least one context that is shared among at least some of the transform coefficients obtained from at least two different ones of the plurality of transforms.

Another advantage/feature is the apparatus having the video encoder as described above, wherein the transform coefficients are two-dimensional transform coefficients, and the unified rule specifies mapping the two-dimensional transform coefficients into a one-dimensional array according to a scanning order, and assigning first N coefficients from among the transform coefficients to separate contexts.

Yet another advantage/feature is the apparatus having the video encoder wherein the transform coefficients are two-dimensional transform coefficients, and the unified rule specifies mapping the two-dimensional transform coefficients into a one-dimensional array according to a scanning order, and assigning first N coefficients from among the transform coefficients to separate contexts as described above, wherein remaining coefficients from among the transform coefficients are assigned to a single context.

Moreover, another advantage/feature is the apparatus having the video encoder wherein the transform coefficients are two-dimensional transform coefficients, and the unified rule specifies mapping the two-dimensional transform coefficients into a one-dimensional array according to a scanning order, and assigning first N coefficients from among the transform coefficients to separate contexts as described above, wherein the scanning order is a zig-zag scanning order.

Further, another advantage/feature is the apparatus having the video encoder as described above, wherein the transform coefficients are encoded into a resultant bitstream, multiple rules are used as candidates for the unified rule, and the unified rule is indicated in the resultant bitstream.

Also, another advantage/feature is the apparatus having the video encoder as described above, wherein the unified rule includes at least two unified rules that vary based on video sequences to which the transform coefficients correspond, picture resolutions, and quantization parameters.

These and other features and advantages of the present principles may be readily ascertained by one of ordinary skill in the pertinent art based on the teachings herein. It is to be understood that the teachings of the present principles may be implemented in various forms of hardware, software, firmware, special purpose processors, or combinations thereof.

Most preferably, the teachings of the present principles are implemented as a combination of hardware and software. Moreover, the software may be implemented as an application program tangibly embodied on a program storage unit. The application program may be uploaded to, and executed by, a machine comprising any suitable architecture. Preferably, the machine is implemented on a computer platform having hardware such as one or more central processing units ("CPU"), a random access memory ("RAM"), and input/output ("I/O") interfaces. The computer platform may also include an operating system and microinstruction code. The various processes and functions described herein may be either part of the microinstruction code or part of the application program, or any combination thereof, which may be executed by a CPU. In addition, various other peripheral units may be connected to the computer platform such as an additional data storage unit and a printing unit.

It is to be further understood that, because some of the constituent system components and methods depicted in the accompanying drawings are preferably implemented in software, the actual connections between the system components or the process function blocks may differ depending upon the manner in which the present principles are programmed. Given the teachings herein, one of ordinary skill in the pertinent art will be able to contemplate these and similar implementations or configurations of the present principles.

Although the illustrative embodiments have been described herein with reference to the accompanying drawings, it is to be understood that the present principles is not limited to those precise embodiments, and that various changes and modifications may be effected therein by one of ordinary skill in the pertinent art without departing from the scope or spirit of the present principles. All such changes and modifications are intended to be included within the scope of the present principles as set forth in the appended claims.

The invention claimed is:

1. An apparatus, comprising: a memory; and a processor, configured to: encode transform coefficients for at least a portion of a picture, the transform coefficients obtained using a plurality of transform sizes, determine a rule for creating a context sharing map wherein the context sharing map is defined as a map indicative of a probability model for one or more bins of a binary sequence created by uniquely mapping a given non-binary syntax element shared among a plurality of different transform coefficient positions; provide bitstream syntax indicative of said determined rule; create a context sharing map for the transformed portion of the picture based on said determined rule, wherein one or more context sharing maps are generated for the transform coefficients based on the determined rule used for transformed portion of the picture, the one or more context sharing maps for providing at least one context that is shared among at least some of the transform coefficients obtained from at least two different ones of the plurality of transform sizes.

2. In a video encoder, a method, comprising:
encoding transform coefficients for at least a portion of a picture, the transform coefficients obtained using a plurality of transform sizes, wherein the step of encoding comprises:
determining a rule for creating a context sharing map wherein the context sharing map is defined as a map indicative of a probability model for one or more bins of a binary sequence created by uniquely mapping a given non-binary syntax element shared among a plurality of different transform coefficient positions;
providing bitstream syntax indicative of said determined rule;
creating a context sharing map for the transformed portion of the picture based on said determined rule,
wherein one or more context sharing maps are generated for the transform coefficients based on the determined rule used for transformed portion of the picture, the one or more context sharing maps for providing at least one context that is shared among at least some of the transform coefficients obtained from at least two different ones of the plurality of transforms sizes.

3. The method of claim 2, wherein the transform coefficients are two-dimensional transform coefficients, and the determined rule used for transformed portion of the picture specifies mapping the two-dimensional transform coefficients into a one-dimensional array according to a scanning order, and assigning first N coefficients from among the mapped transform coefficients to separate contexts.

4. The method of claim 3, wherein coefficients other than the first N coefficients from among the mapped transform coefficients are assigned to a single context.

5. The method of claim 3, wherein the scanning order is a zig-zag scanning order.

6. The method of claim 2, wherein the transform coefficients are encoded into a bitstream, multiple rules are used as candidates for the determined rule used for transformed portion of the picture, and the determined rule is indicated in the bitstream.

7. The method of claim 2, wherein the determined rule used for transformed portion of the picture comprises at least two determined rules used for transformed portion of the picture that vary based on video sequences to which the transform coefficients correspond, picture resolutions, and quantization parameters.

8. An apparatus, comprising:
a memory; and
a processor, configured to:
decode a plurality of transform coefficients for at least a portion of a picture, the transform coefficients obtained using a plurality of transform sizes, wherein the video decoder comprises:
determine a rule for creating a context sharing map wherein the context sharing map is defined as a map indicative of a probability model for one or more bins of a binary sequence created by uniquely mapping a given non-binary syntax element shared among different transform coefficient positions;
parse a bitstream for syntax indicative of said determined rule;
create a context sharing map for the transformed portion of the picture based on said determined rule,
wherein one or more context sharing maps are generated for the transform coefficients based on the determined rule used for transformed portion of the picture, the one or more context sharing maps for providing at least one context that is shared among at least some of the transform coefficients obtained from at least two different ones of the plurality of transform sizes.

9. In a video decoder, a method, comprising:
decoding transform coefficients for at least a portion of a picture, the transform coefficients obtained using a plurality of transform sizes, wherein the step of decoding comprises:
determining a rule for creating a context sharing map wherein the context sharing map is defined as a map indicative of a probability model for one or more bins of a binary sequence created by uniquely mapping a given non-binary syntax element shared among different transform coefficient positions;

finding bitstream syntax indicative of said determined rule; and creating a context sharing map for the transformed portion of the picture based on said determined rule, wherein one or more context sharing maps are generated for the transform coefficients based on the determined rule used for transformed portion of the picture, the one or more context sharing maps for providing at least one context that is shared among at least some of the transform coefficients obtained from at least two different ones of the plurality of transform sizes.

10. The method of claim 9, wherein the transform coefficients are two-dimensional transform coefficients, and the determined rule used for transformed portion of the picture, specifies mapping the two-dimensional transform coefficients into a one-dimensional array according to a scanning order, and assigning first N coefficients from among the mapped transform coefficients to separate contexts.

11. The method of claim 10, wherein coefficients other than the first N coefficients from among the mapped transform coefficients are assigned to a single context.

12. The method of claim 10, wherein the scanning order is a zig-zag scanning order.

13. The method of claim 9, wherein the transform coefficients are decoded from a bitstream, multiple rules are used as candidates for the determined rule used for transformed portion of the picture and the determined rule used for transformed portion of the picture is determined from the bitstream.

14. The method of claim 9, wherein the determined rule used for transformed portion of the picture comprises at least two determined rules used for transformed portion of the picture that vary based on video sequences to which the transform coefficients correspond, picture resolutions, and quantization parameters.

15. A non-transitory computer readable storage media having video signal data encoded thereupon, comprising:

transform coefficients encoded for at least a portion of a picture, the transform coefficients obtained using a plurality of transform sizes; and bitstream syntax indicative of a rule for creating a context sharing map wherein the context sharing map is defined as a map indicative of a probability model for one or more bins of a binary sequence created by uniquely mapping a given non-binary syntax element shared among different transform coefficient positions;

wherein one or more context sharing maps are generated for the transform coefficients based on the rule used for transformed portion of the picture by a video decoder, the one or more context sharing maps for providing at least one context that is shared among at least some of the transform coefficients obtained from at least two different ones of the plurality of transform sizes.

* * * * *